(12) United States Patent
Kaminaga

(10) Patent No.: US 10,496,474 B2
(45) Date of Patent: Dec. 3, 2019

(54) SEMICONDUCTOR STORAGE DEVICE AND MEMORY SYSTEM HAVING THE SAME

(71) Applicant: Winbond Electronics Corp., Taichung (TW)

(72) Inventor: Takehiro Kaminaga, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 26 days.

(21) Appl. No.: 15/594,670

(22) Filed: May 15, 2017

(65) Prior Publication Data

US 2017/0329670 A1 Nov. 16, 2017

(30) Foreign Application Priority Data

May 16, 2016 (JP) ................................ 2016-097870

(51) Int. Cl.
- *G06F 11/00* (2006.01)
- *G06F 11/10* (2006.01)
- *G11C 29/52* (2006.01)

(52) U.S. Cl.
CPC .......... *G06F 11/1068* (2013.01); *G11C 29/52* (2013.01)

(58) Field of Classification Search
None
See application file for complete search history.

(56) References Cited

U.S. PATENT DOCUMENTS

| | | | | |
|---|---|---|---|---|
| 8,135,935 B2* | 3/2012 | Haertel | ............... | G06F 11/1044 711/202 |
| 8,555,141 B2* | 10/2013 | Hicken | ................ | G11C 16/04 714/763 |
| 2004/0205418 A1* | 10/2004 | Sakaue | ............... | G06F 11/1068 714/52 |
| 2009/0091990 A1* | 4/2009 | Park | .................... | G11C 11/5628 365/189.011 |
| 2011/0041039 A1* | 2/2011 | Harari | ................ | G06F 11/1068 714/773 |
| 2012/0226963 A1* | 9/2012 | Bivens | ................... | G11C 29/42 714/773 |
| 2013/0039129 A1 | 2/2013 | Radke et al. | | |
| 2013/0073895 A1* | 3/2013 | Cohen | ................ | G06F 11/1096 714/6.2 |
| 2013/0290797 A1 | 10/2013 | He et al. | | |

(Continued)

FOREIGN PATENT DOCUMENTS

| | | |
|---|---|---|
| JP | 2004280790 | 10/2004 |
| JP | 2010152989 | 7/2010 |

(Continued)

OTHER PUBLICATIONS

"Office Action of Korean Counterpart Application," dated Jan. 29, 2018, p. 1-p. 7.

(Continued)

*Primary Examiner* — Mujtaba M Chaudry
(74) *Attorney, Agent, or Firm* — JCIPRNET

(57) ABSTRACT

A semiconductor storage device and a memory system having the same. The semiconductor storage device includes a memory array, an error checking/correction (ECC) element, and a setting element. The ECC element stores generated error correction codes to a storage area. The setting element can set the storage area from the external.

19 Claims, 10 Drawing Sheets

(56) References Cited

U.S. PATENT DOCUMENTS

2014/0334228 A1* 11/2014 Kim .................... G06F 11/1072
                                                    365/185.03
2015/0278118 A1* 10/2015 Lee ...................... G06F 12/145
                                                    711/102

FOREIGN PATENT DOCUMENTS

| JP | 2014522075 | 8/2014 |
| JP | 2015056184 | 3/2015 |

OTHER PUBLICATIONS

"Office Action of Japan Counterpart Application," with English translation thereof, dated Feb. 28, 2017, p. 1-p. 16.

* cited by examiner

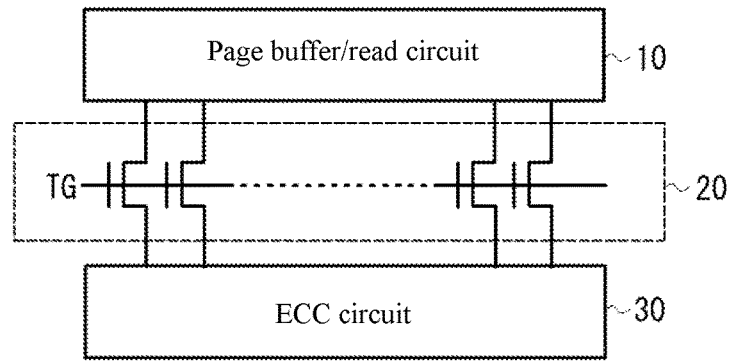
FIG.1(PRIOR ART)
FIG.2(A) (PRIOR ART)
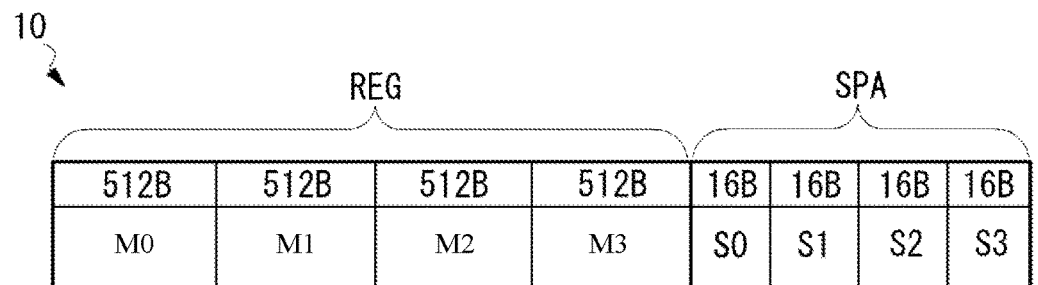
FIG.2(B) (PRIOR ART)
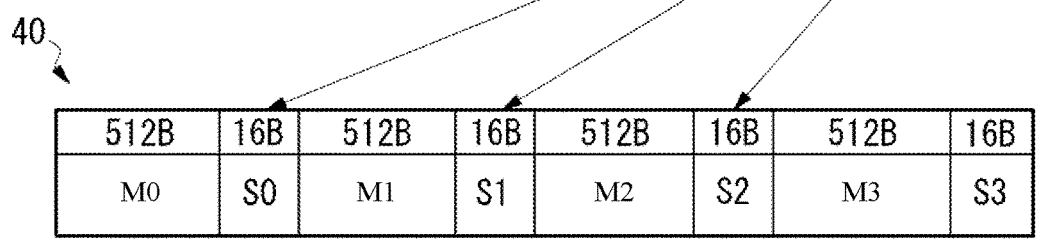

| 0 | 1 | 2 | 3 | 4 | 5 | 6 | 7 | 8 | 9 | A | B | C | D | E | F |
|---|---|---|---|---|---|---|---|---|---|---|---|---|---|---|---|
| Bad block identification || User data 2 || User data 1 |||| ECC of M0 |||||| ECC of S0 ||

FIG.3(A) (PRIOR ART)

| 0 | 1 | 2 | 3 | 4 | 5 | 6 | 7 | 8 | 9 | A | B | C | D | E | F |
|---|---|---|---|---|---|---|---|---|---|---|---|---|---|---|---|
| Reserved || User data 2 || User data 1 |||| ECC of M0 and S0 ||||||||

FIG.3(B) (PRIOR ART)

| 0 | 1 | 2 | 3 | 4 | 5 | 6 | 7 | 8 | 9 | A | B | C | D | E | F |
|---|---|---|---|---|---|---|---|---|---|---|---|---|---|---|---|
| Reserved | ECC of M0 ||| ECC of S0 ||| User data |||||||||

FIG.3(C) (PRIOR ART)

| 0 | 1 | 2 | 3 | 4 | 5 | 6 | 7 | 8 | 9 | A | B | C | D | E | F |
|---|---|---|---|---|---|---|---|---|---|---|---|---|---|---|---|
| Reserved | Main and spare ECC |||||||| Metadata |||||||

FIG.3(D) (PRIOR ART)

| 0 | 1 | 2 | 3 | 4 | 5 | 6 | 7 | 8 | 9 | A | B | C | D | E | F |
|---|---|---|---|---|---|---|---|---|---|---|---|---|---|---|---|
| Bad block identification | | User data 2 | | User data 1 | | | | ECC of M0 | | | | | | ECC of S0 | |

FIG.9(A)

| 0 | 1 | 2 | 3 | 4 | 5 | 6 | 7 | 8 | 9 | A | B | C | D | E | F |
|---|---|---|---|---|---|---|---|---|---|---|---|---|---|---|---|
| Reserved | | Main and spare ECC | | | | | | | | Metadata | | | | | |

FIG.9(B)

| 0 | 1 | 2 | 3 | 4 | 5 | 6 | 7 | 8 | 9 | A | B | C | D | E | F |
|---|---|---|---|---|---|---|---|---|---|---|---|---|---|---|---|
| Bad block identification | | ECC of M0 | | | | | | | | Idle | | | | | |

FIG.9(C)

SEMICONDUCTOR STORAGE DEVICE AND MEMORY SYSTEM HAVING THE SAME

CROSS-REFERENCE TO RELATED APPLICATION

This application claims the priority benefit of Japan application serial no. 2016-097870, filed on May 16, 2016. The entirety of the above-mentioned patent application is hereby incorporated by reference herein and made a part of this specification.

BACKGROUND

Field of the Invention

The invention is directed to a semiconductor storage device and more particularly, to a semiconductor storage device with an on-chip error checking/correction (ECC) function and a memory system having the same.

Description of Related Art

In an NAND flash memory, data programming or erasing is repetitively performed, and therefore, due to deterioration of the charge maintaining characteristic resulting from the deterioration of a tunnel insulating film or a change in a threshold value resulting from the charges captured by the tunnel insulating film, a bit error may occur during a reading operation. Japanese Patent Publication No. 2010-152989 discloses mounting an error checking/correction (ECC) circuit as a solution against such bit error.

Along with the miniaturization of the NAND flash memory, the number of the error bits occurring during the process of the reading operation tends to increase. Each manufacturer, for the purposes of providing compatibility with former products and for easier use in systems, has developed a product capable of executing an ECC function by utilizing elements thereof, which is called an on-chip ECC product. The on-chip ECC product performs the following operation: automatically calculating code information used for ECC calculation inside the device and writing the information into a predetermined address area.

FIG. 1 illustrates a sector M of an NAND flash memory provided with an ECC function on a chip. In the flash memory with the ECC function on the chip, ECC can be enabled/disabled by a command, setting or the like. During a programming operation, data input from an external I/O terminal is loaded into a page buffer/read circuit 10, the loaded data is transmitted to an ECC circuit 30 via a transmission circuit 20. The transmission circuit 20 includes a plurality of transistors capable of bidirectional data transmission, and each transistor is driven based on control signals TG commonly connected to a gate. The ECC circuit 30 performs the following operations: performing an ECC operation on the transmitted data, generating an error correction code for error checking/correction and rewriting the error correction code to a spare area of the page buffer/read circuit 10. Thereafter, data to be programmed and the error correction code held by the page buffer/read circuit 10 are programmed into a selected page of a memory array. In addition, during a reading operation, the data read from the selected page of the memory array is held in the page buffer/read circuit 10, and the held data is subsequently transmitted to the ECC circuit 30 via the transmission circuit 20. The ECC circuit 30 performs the error detection and correction on the read data based on the error correction code, and in a condition that an error is detected, corrected data is set to the page buffer/read circuit 10. Then, the data held by the page buffer/read circuit 10 is output from the external I/O terminals.

Nevertheless, the following issues exist in the conventional flash memory with the on-chip ECC function. FIG. 2(A) illustrates an example of address mapping of a spare area on a flash memory side with the on-chip ECC function, and FIG. 2(B) illustrates an example of address mapping of a spare area on a system 40 side. As illustrated in FIG. 2(A), the page buffer/read circuit 10 includes, for example, a regular area REG of 2K bytes (512 B×4) and a spare area SPA of 64 bytes (16 B×4). In this circumstance, the regular area REG is divided into 4 main sectors (i.e., M0, M1, M2 and M3), data is loaded into each sector, and ECC processing is performed with each sector as a unit. At this time, error correction codes generated by ECC calculation are stored in the spare area SPA. In the spare area SPA, a sector S0 of 16 bytes stores an error correction code corresponding to the sector M0, a sector S1 stores an error correction code corresponding to the sector M1, a sector S2 stores an error correction code corresponding to the sector M2, and a sector S3 stores an error correction code corresponding to the sector M3. Thereafter, data of the regular area REG and data of the spare area SPA held by the page buffer/read circuit 10 are programmed into a regular area REG and a spare area SPA of the selected page in the memory array.

On the other hand, the system 40 capable of executing the ECC function is as illustrated in FIG. 2(B). If it is configured that each 512-byte M sector and the 16-byte spare area are paired, at least addresses of the sectors S0 and S1 in the spare area on the system 40 side overlap addresses of the regular area REG on the flash memory side. Therefore, in order to achieve the compatibility with the flash memory executing the on-chip ECC function, firmware on the system 40 side has to be changed, such that the addresses of the spare areas of both can be consistent. Thus, it cannot be said that there is complete compatibility between the flash memory with the on-chip ECC function and the system 40.

FIG. 3(A) to FIG. 3(D) illustrate an example of one spare area (16 bytes), where FIG. 3(A), FIG. 3(B) and FIG. 3(C) respectively illustrate a spare area on the flash memory side with different specifications, and FIG. 3(D) illustrates a spare area on the system side. In the flash memory illustrated in FIG. 3(A), identification information for identifying whether the spare area is in a bad block is stored in the first 2 bytes, then, user data is stored in the next 6 bytes, the error correction code corresponding to the sector M0 is stored in the following 6 bytes, and an error correction code related to the error correction code of the sector S0 (which is referred to as an error correction code of the spare area) is stored in the last 2 bytes. In the flash memory illustrated in FIG. 3(B), the error correction code corresponding to the sector M0 and the error correction codes of the spare area are stored in 8 bytes of "8 to F". In scenarios illustrated in FIG. 3(A) and FIG. 3(B), the error correction codes are stored at the same byte positions, but positions for storing the error correction codes of the spare area are not necessarily consistent. In the flash memory illustrated in FIG. 3(C), the error correction code corresponding to the sector M0 is stored in 3 bytes of "1 to 3", and the error correction codes of the spare area are stored in 4 bytes of "4 to 7". In contrast, on the system side illustrated in FIG. 3(D), the error correction codes of the main sectors of the regular area and the error correction codes of the spare area are stored in 8 bytes of "2 to 9", and metadata that can be freely used by a user is stored in 6 bytes of "A to F". In this way, even though the addresses of the spare areas of the flash memory and of the system side are consistent, but there is not complete compatibility between the flash memory side and the system side if the error correction codes are stored in different positions in the spare areas.

SUMMARY

A purpose of the invention is to solve the issues of the related art and provides a semiconductor storage device with an error correction function and a memory system having the same to achieve compatibility with an existing system.

A semiconductor storage device of the invention includes a memory array, an error checking/correction (ECC) element configured to correct errors of data stored in the memory array or errors of data read from the memory array and store an error correction code generated for the error correction in a storage area, and a setting element configured to set the storage area from the external.

A memory system of the invention includes a semiconductor storage device having the aforementioned structure and an external controller connected with the semiconductor storage device. The external controller outputs address information employed to set the storage area to the semiconductor storage device. In a preferable aspect, the external controller receives information set by the setting element and outputs the address information based on the received information.

According to the invention, the storage area storing the error correction codes can be set from the external, thereby changing the storage area of the semiconductor storage device to achieve data compatibility of the semiconductor storage device with the existing system, without changing the specification of the existing system.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 1 is a schematic view of an on-chip error checking/correction (ECC) operation of a conventional flash memory.

FIG. 2(A) and FIG. 2(B) illustrate conventional examples of different address mappings between the spare area of the flash memory and the spare area of the host device (system).

FIG. 3(A) to FIG. 3(D) illustrate a conventional example of storing information in the spare area of the flash memory and the spare area of the host device (system) side.

FIG. 9(A) to FIG. 9(C) illustrate an example of changing the storage area of the error correction code according to an embodiment of the invention.

DESCRIPTION OF EMBODIMENTS

Embodiments of the invention are provided below for detail description with reference to the drawings. Herein, an NAND flash memory is exemplarily illustrated as a preferable aspect of a semiconductor storage device.

Figure 4:
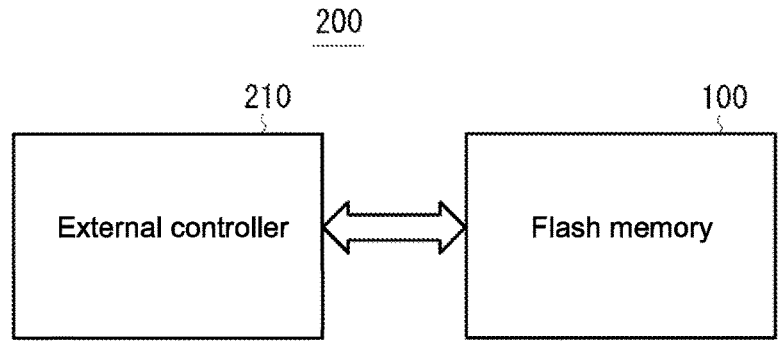
FIG. 4 illustrates an exemplary structure of a memory system according to an embodiment of the invention.

FIG. 4 illustrates an exemplary structure of a memory system according to an embodiment of the invention. A memory system 200 includes an external controller 210 and a flash memory 100 connected with the external controller 210. The external controller 210 is not particularly limited in the invention and may be an electronic device or a host device, such as a computer, a digital camera, a printer or a memory controller. The external controller 210 sends commands, data, control signals to the flash memory 100 to control operations (e.g., programming, reading, erasing, setting and so on) of the flash memory 100.

Figure 5:
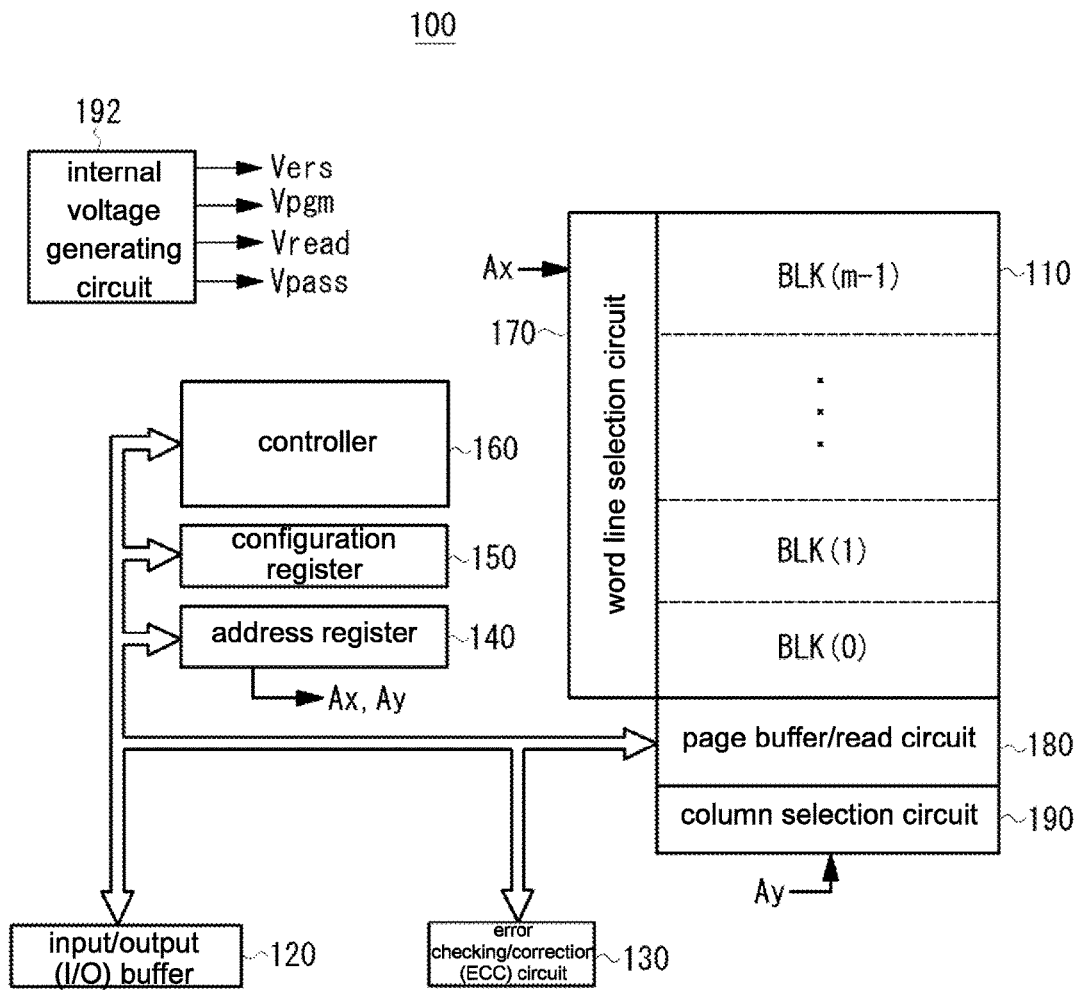
FIG. 5 is a schematic view illustrating an overall structure of an NAND flash memory according to an embodiment of the invention.

FIG. 5 illustrates a structure of the flash memory 100. The flash memory 100 includes a memory array 110, an input/output (I/O) buffer 120, an error checking/correction (ECC) circuit 130, an address register 140, a configuration register 150, a controller 160, a word line selection circuit 170, a page buffer/read circuit 180, a column selection circuit 190 and an internal voltage generating circuit 192. The memory array 110 includes a plurality of memory cells arranged in an array. The I/O buffer 120 is connected to an external I/O terminal and holds I/O data. The ECC circuit 130 performs error checking/correction on data to be programmed into the memory array 110 or data read therefrom. The address register 140 receives address data from the I/O buffer 120. The configuration register 150 stores the address information which stores error correction codes generated by the ECC circuit 130. The controller 160 controls each element based on the command data or the control signals from the external controller 210. The word line selection circuit 170 receives address information Ax from the address register 140, decodes the address information Ax and selects a block or a word line based on the decoding result. The page buffer/read circuit 180 holds data read from a page selected by the word line selection circuit 170, or holds data to be programmed into the selected page. The column selection circuit 190 receives column address information Ay from the address register 140, decodes the column address information Ay, and selects a column in the page buffer/read circuit 180 based on the decoding result. The internal voltage generating circuit 192 generates various voltages (e.g., a write voltage Vpgm, a pass voltage Vpass, a read voltage Vread, an erase voltage Vers) for reading, programming and erasing data.

The memory array 110 has m memory blocks BLK (0), BLK (1), . . . and BLK (m−1) arranged along a column direction. A plurality of NAND strings are formed in one memory block, and each of the NAND strings is formed by cascading a plurality of memory cells. For example, a memory cell has a metal oxide semiconductor (MOS) structure, and the MOS structure includes a source/drain serving as a N-type diffusion region and formed in a P-well, a tunnel oxide film formed on a channel between the source and the drain, a floating gate (i.e., an electric charge accumulating layer) formed on the tunnel oxide film and a control gate formed on the floating gate through a dielectric film. The NAND strings may be formed either in a two-dimensional array or in a three-dimensional array. And, each memory cell may be a single level cell (SLC) type that can store data of 1 bit (binary data), or a multi level cell (MLC) type that can store data of multiple bits.

Table 1 shows an example of applying bias voltages to each operation of the flash memory. During a reading operation, a specific positive voltage is applied to bit lines, a specific voltage (e.g., 0 V) is applied to selected word lines, a specific pass voltage Vpass (e.g., 4.5 V) is applied to non-selected word lines, and a positive voltage (e.g., 4.5 V) is applied to selection gate lines SGD and SGS, such that bit line side selection transistors and source line side selection transistors of the NAND strings are turned on, and 0 V is applied to a common source line. During a programming (writing) operation, a high-level programming voltage Vpgm (e.g., 15 V to 20 V) is applied to the selected word lines, and an intermediate-level voltage (e.g., 10 V) is applied to the non-selected word lines, such that the bit line side selection transistors are turned on, the source line side selection transistors are turned off, and potentials corresponding to data "0" or "1" are provided to the bit lines. During an erasing operation, 0 V is applied to the selected word line within each block, and a high-level voltage (e.g., 21 V) is applied to each p-well, and electric charges of the floating gate are drawn out of a substrate, thereby erasing data with a block as a unit.

TABLE 1

|  | Erasing | Writing | Reading |
| --- | --- | --- | --- |
| Selected word line | 0 | 15 V-20 V | 0 |
| Non-selected word line | F | 10 V | 4.5 |
| SGD | F | Vcc | 4.5 |
| SGS | F | 0 | 4.5 |
| SL | F | Vcc | 0 |
| P-well | 21 | 0 | 0 |

The ECC circuit 130 may be enabled or disabled by a command or a factory setting. In a scenario that an on-chip ECC function is enabled, when data to be programmed is loaded into the page buffer/read circuit 180 via the I/O buffer 120 during the programming operation, the ECC circuit 130 calculates the data transmitted from the page buffer/read circuit 180, so as to generate an error correction code. The ECC calculation is performed by a commonly known method through, for example, parity check, hamming code or Reed-Solomon, in which input data of k bits or k bytes is converted into p=k+q. "q" represents an error correction code or a parity check bit required for the ECC function performed on the data. The ECC circuit 130 stores the generated error correction code in a spare area of the page buffer/read circuit 180. In this way, the data and the error correction code set to the page buffer/read circuit 180 are programmed into a selected page of the memory array 110.

During the reading operation, when the data read from the selected page of the memory array 110 is held in the page buffer/read circuit 180, the ECC circuit 130 performs error detection based on the data and the error correction code transmitted from the page buffer/read circuit 180, and sets corrected data to the page buffer/read circuit 180 in a condition that an error is detected. Meanwhile, the data held by the page buffer/read circuit 180 is output via the I/O buffer 120.

A configuration (CF) register 150 typically stores various information for defining operations performed on the flash memory 100, but the CF register 150 of the present embodiment is configured to store information used for setting the storage area employed for storing the error correction codes of the spare area, i.e., configured to store address information of the error correction code generated by the ECC circuit 130. The CF register 150 includes a rewritable non-volatile memory, and the external controller 210 accesses the CF register 150 by, for example, outputting a specific command, so as to change setting contents of the CF register 150. Alternatively, without relying on the command, the external controller 210 accesses the CF register 150 when the flash memory 100 is in a specific mode (e.g., a test mode), so as to change the setting of the CF register 150.

Figure 6:
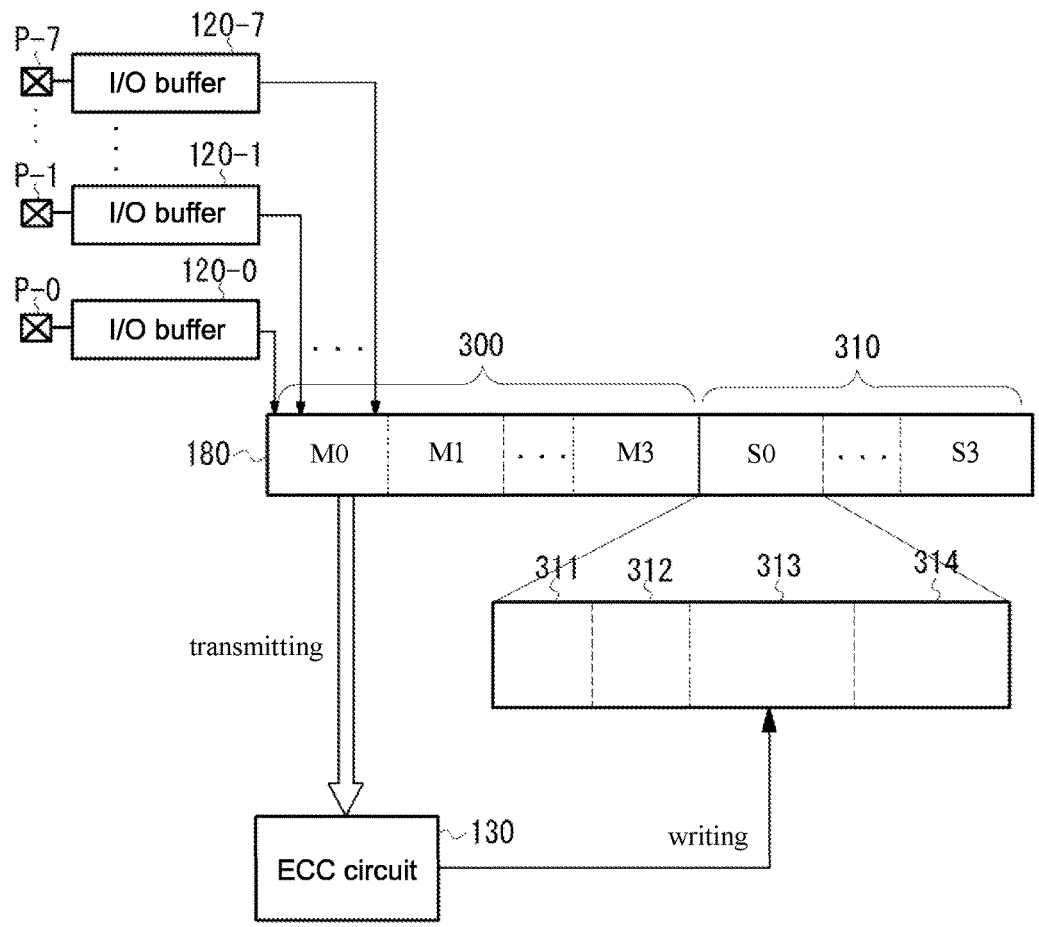
FIG. 6 illustrates the ECC processing of the regular area during the programming operation according to an embodiment of the invention.

In the CF register 150, the address information for defining the storage area of the error correction code is held, but in a default setting, as illustrated in FIG. 2(A), all spare sectors S0 to S3 (16 B×4) next to the sector M3 in the regular area are set to the storage area of the error correction code. FIG. 6 illustrates an example of the ECC processing when the address information is default setting.

When the controller 160 receives a programming command via the I/O buffer 120, a sequence for programming starts. When the flash memory 100 has 8 external I/O terminals P0 to P7, the flash memory 100 loads input data into the page buffer/read circuit 180 from the external I/O terminals P0 to P7 respectively via I/O buffers 120-1 to 120-7. In the case of this example, the page buffer/read circuit 180 has a regular area 300 which is divided into 4 main sectors (sectors M0 to M3) and a spare area 310 which is divided into 4 sectors (sectors S0, S1, S2 and S3). One sector of the regular area 300 contains 512 bytes, and one sector of the spare area 310 contains 16 bytes.

One of the sectors of the spare area 310 has, for example, an area 311 storing information employed for identifying bad blocks containing defective memory cells, an area 312 storing user data, an area 313 storing an error correction code related to a sector of the regular area 300 and an area 314 storing an error correction code during the ECC operation performed on the spare area 310. An area 313 of spare 0 stores an error correction code corresponding to the sector M0, an area 313 of spare 1 stores an error correction code corresponding to the sector M1, spare 2 stores an error correction code corresponding to the sector M2, and spare 3 stores an error correction code corresponding to the sector M3.

The I/O buffers 120-0 to 120-7 are assigned to a sector of the regular area 300, namely, 512 bits (i.e., 512 bits×8=1 sector) is assigned to each external I/O terminal. The column selection circuit 190 decodes the column address information Ay received during the programming operation and selects a sector to load the input data from the external I/O terminals P-0 to P7 based on the decoding result. FIG. 6 illustrates an example of loading the received input data into the sector M0 by using the external I/O terminals P-0 to P-7.

Additionally, the ECC circuit 130 of the present embodiment includes a write circuit configured employed for writing error correction codes. Preferably, the ECC circuit 130 may perform the ECC operation until the number of bytes of the data is equal to that of a sector of the regular area 300. If a sector of the regular area 300 has 512 bytes, the ECC circuit performs the ECC operation on the data of 512 bytes to generate an error correction code for correcting an error of 1 bit, for example. In this circumstance, in all of the 4 sectors, up to errors of 4 bits can be corrected.

The ECC circuit 130 writes the generated error correction code into the corresponding area 313 of the spare area 310. In the example illustrated in FIG. 6, the input data Di is loaded into the sector M0, and thus, the error correction code is written into the area 313 of the sector S0.

Figure 7:
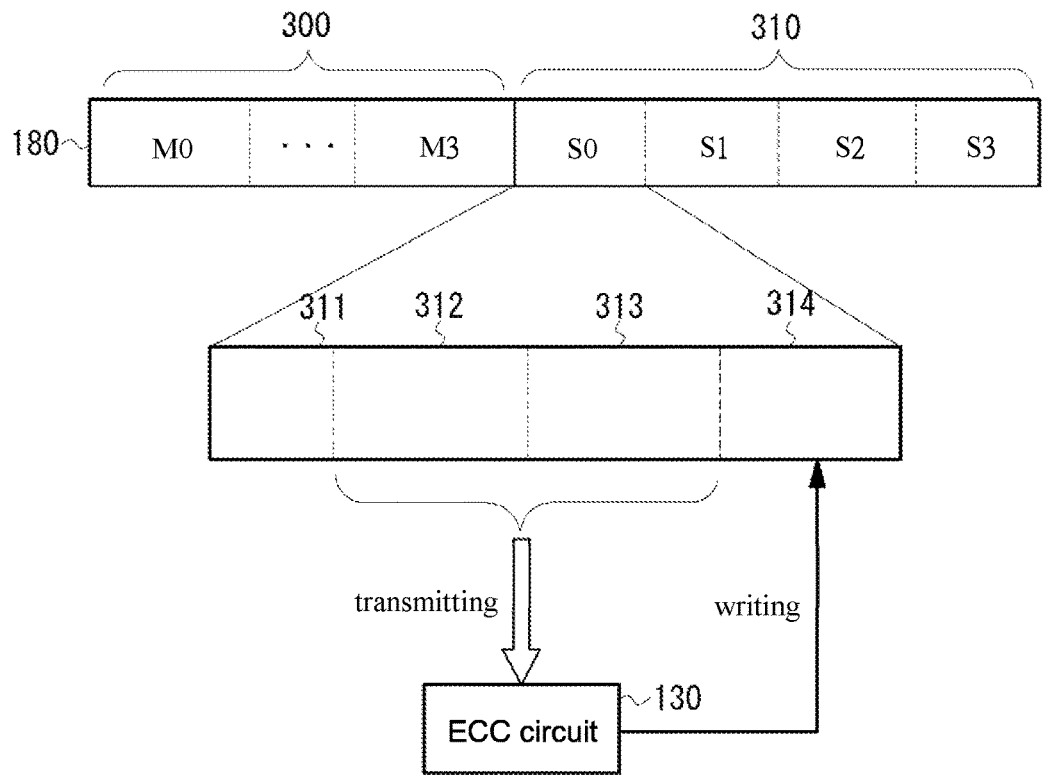
FIG. 7 illustrates the ECC processing of the spare area during the programming operation according to an embodiment of the invention.

FIG. 7 illustrates the ECC processing of the data in the spare area 310. After the ECC processing performed on each sector in the regular area 300 is finished, the ECC processing is then performed on each sector of the spare area 310. Although it is arbitrary that on which data included in one sector of the spare area 310 the ECC processing is performed, in the present embodiment, the ECC processing is performed on the data of the areas 312 and 313. Thus, the data of the areas 312 and 313 of the sector S0 are transmitted to the ECC circuit 130, and an error correction code generated by the ECC processing is written into the area 314 of the sector S0. The processing is also performed on other sectors, i.e. S1 to S3. When the ECC processing is finished, the programming operation of the selected page of the memory array 110 starts.

Figure 8:
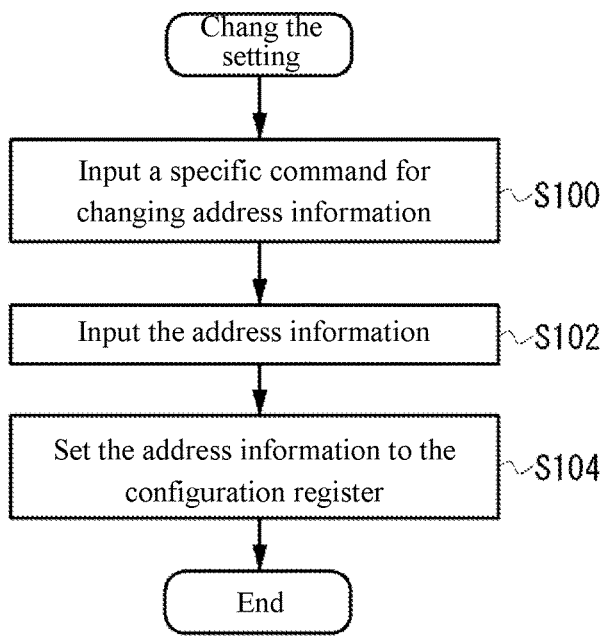
FIG. 8 is a flowchart illustrating the operation of setting the storage area of the error correction code for the spare area according to an embodiment of the invention.

Subsequently, description related to the change of the address information held by the CF register 150 will be set forth in detail. FIG. 8 is a flowchart illustrating the operation of changing or setting the address information. First, the external controller 210 outputs a specific command for changing the setting of the CF register 150 to the flash memory 100, and the specific command is accepted by the flash memory 100 (step S100). The controller 160, in response to the received specific command, starts a procedure for changing the setting of the CF register 150.

The external controller 210 outputs address information for regulating the storage area of the error correction code to the flash memory 100, and the address information is input into the flash memory 100 (step S102). The controller 160 changes the setting contents of the CF register 150 according to the input address information (step S104).

Herein, the address information transmitted from the external controller 210 preferably includes a start address and a size (bytes) for storing an error correction code. It is assumed in a condition that the regular area 300 and the spare area 310 illustrated in FIG. 6 are set, the address information includes a start address and a size for storing the error correction code of each of the sector S0, S1, S2 and S3. In the case of the sector S0, the address information includes the start address of the area 313 and the size calculated therefrom.

Hereinafter, description related to a specific example of changing the storage area of the error correction code will be set forth below. FIG. 9(A) illustrates a structure of a default spare area on the flash memory side, FIG. 9(B) illustrates a structure of a spare area on the system side, and FIG. 9(C) illustrates an example where the storage area of the error correction codes of the spare area illustrated in FIG. 9(A) is changed according to an embodiment. In FIG. 9(A), the storage area of the error correction codes is an area regulated by 8 bytes starting from a start address of "8", and the storage area of the error correction codes on the system side as illustrated in FIG. 9(B) is an area regulated by 8 bytes starting from a start address of "2". A meta area of 6 bytes of "A to F" on the system side is an area for a user to store data. In order to achieve compatibility with the system, the storage area of the error correction codes of bytes "A to F" on the flash memory side which overlaps the meta area have to be changed. In the present embodiment, in order to change the storage area of the error correction code on the flash memory side, the external controller 210 outputs the address information containing a start address of "2" and a size of 8 bytes to the flash memory 100, and the controller 160 change the setting contents of the CF register 150 according to the input address information. Therefore, as illustrated in FIG. 9(C), the storage area of the error correction codes is an area of 8 bytes starting from a start address of "2", where is consistent with the storage area of the error correction codes on the system side.

Figure 10A:
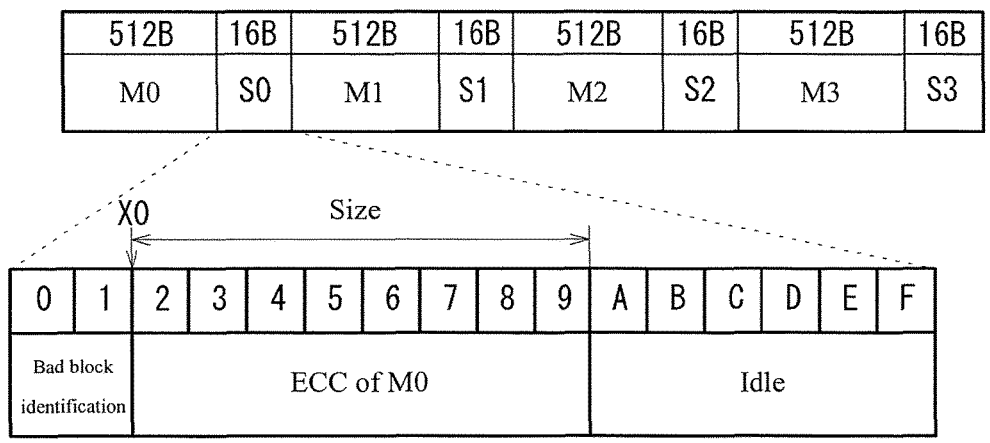
FIG. 10(A) and FIG. 10(B) illustrate a specific example of changing the storage area of the error correction code when the spare area is at different positions.
Figure 10B:
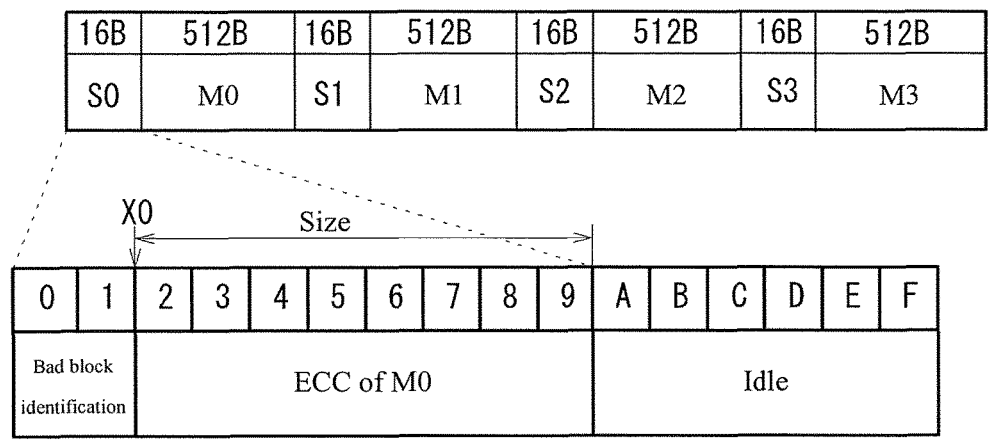

FIG. 9(A) to FIG. 9(C) illustrate the examples where positions of the spare area on the flash memory side and the system side are consistent. However, as illustrated in FIG. 2(A) and FIG. 2(B), the address information containing the start address and the size may be set to the CF register 150 to change the storage area of the error correction code even though the spare area is at different positions. The sectors M0 to M3 of the regular area are 2048 bytes in total, the sectors S0 to S3 of the spare area are 64 bytes in total, and a sum thereof is 2112 bytes, in which start addresses and sizes employed for storing error correction code are set. Namely, as illustrated in FIG. 10(A), a start address X0 employed for storing the error correction code corresponding to the sector M0 is 514 (which is calculated by 512B+2B) and a size thereof is 8 bytes. Thereafter, according to the structure illustrated in FIG. 9(C), as a size of a free space (marked as "Idle") is 6 bytes, a size of the next sector M1 is 512 bytes, and a size of an immediately following bad block identification is 2 bytes, a start address X1 of a sector S1 of the next spare area is 1042 (which is calculated by 512+16+512+2), a start address X2 of a sector S2 is 1570, and a start address of the last sector S3 is 2098. Additionally, the size of all the storage areas of the error correction codes are 8 bytes. In addition, if it is assumed that the spare area SPA illustrated in FIG. 2(A) is to be changed to, a start address of the sector S0 of the spare area is 2050, a start address of the sector S1 is 2066, a start address of the sector S2 is 2082, and a start address of the sector S3 is 2098. Additionally, sizes of all the storage areas of the error correction codes are 8 bytes. In addition, FIG. 10(B) illustrates an example where the sectors of the regular area are in inverted address mapping to the sectors of the spare area illustrated in FIG. 10(A). The sector S0 of the spare area stores the error correction code corresponding to the sector M0 of the regular area. In the same way, the sectors S1, S2 and S3 of the spare area respectively store the error correction codes corresponding to the sectors M1, M2 and M3 of the regular area. In the scenario of FIG. 10(B), the address information containing the start address and the size of the storage areas of the error correction codes stored in each of the sectors S0, S1, S2 and S3 of the spare area can be changed in the same way as described above.

Figure 11A:
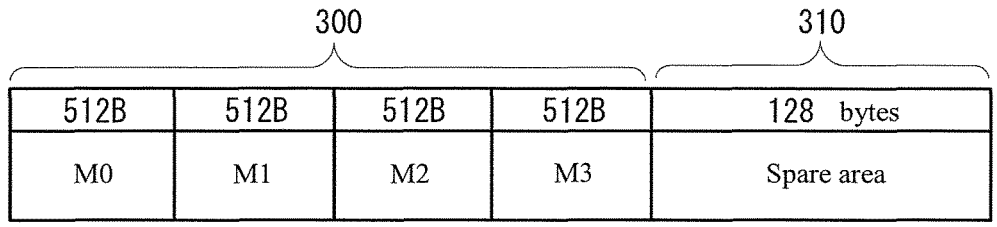
FIG. 11(A) to FIG. 11(D) illustrate other examples of changing the storage area of the error correction code according to an embodiment of the invention.
Figure 11B:
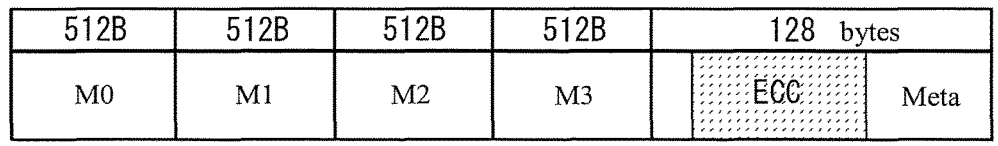
Figure 11C:
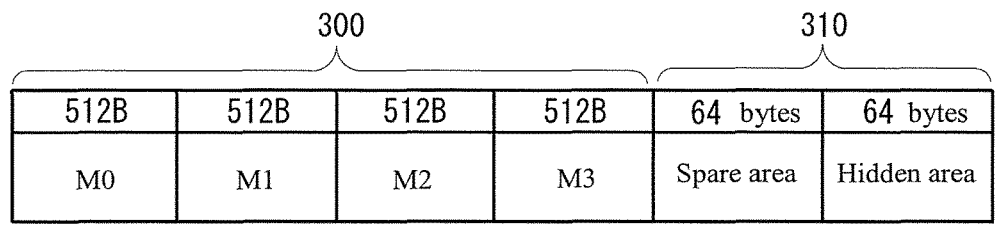
Figure 11D:
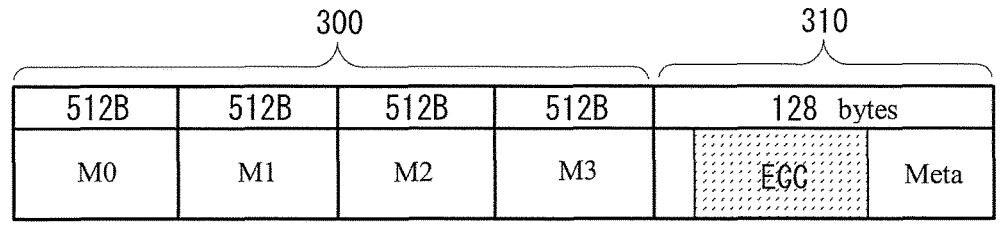

FIG. 11(A) to FIG. 11(D) illustrate other examples of changing the storage area of the error correction code based on the present embodiment. FIG. 11(A) illustrates an example of a page buffer on the flash memory side when the on-chip ECC mode is disabled. The page buffer has a regular area 300 of 2048 bytes which is divided into sectors M0 to M3 and a spare area 310 of 128 bytes. FIG. 11(B) illustrates a structure of a page buffer on the system side, in which a storage area (represented as ECC) for storing error correction codes and a meta area for storing user data are set in a spare area of 128 bytes. FIG. 11(C) illustrates the structure of the page buffer of the flash memory illustrated in FIG. 11(A) when the ECC mode is enabled, and in this circumstance, the spare area of 128 bytes is set to include a spare area of 64 bytes and a hidden area (which is hidden from the user) of 64 bytes. In this case, the hidden area of 64 bytes overlaps the meta area on the system side, such that data compatibility between the systems is compromised. Therefore, in the flash memory illustrated in FIG. 11(D) which the present embodiment is applied to, the storage area in the spare area 310 of 128 bytes which is employed for storing the error correction codes can be changed in this way to be consistent with the storage area on the system side for storing the error correction codes. As a result, the meta area on the system side can be directly used.

Figure 12:
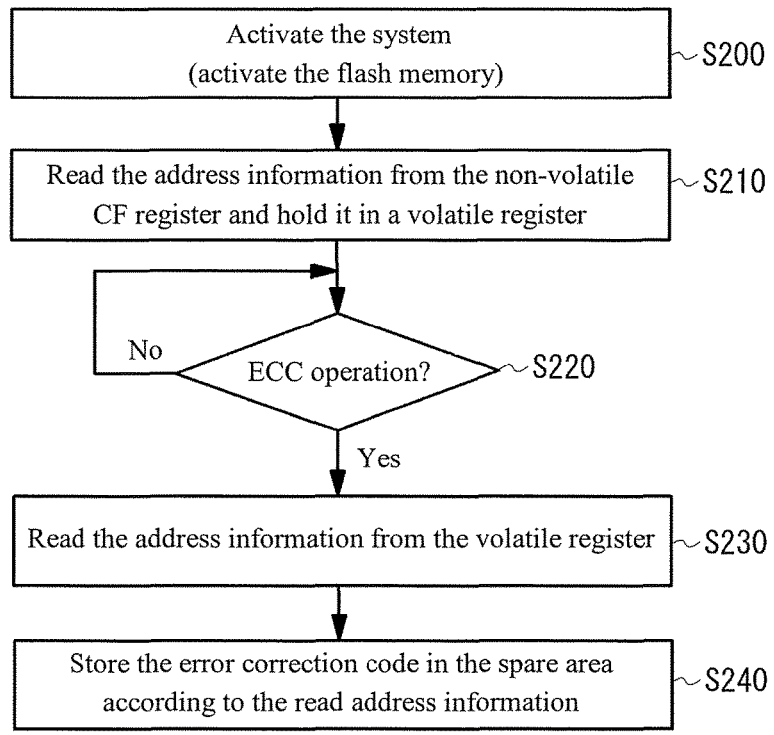
FIG. 12 is a flowchart illustrating an example of the ECC operation according to an embodiment of the invention.

Hereinafter, a flow of an ECC operation of the present embodiment will be described with reference to FIG. 12. When the system 200 illustrated in FIG. 4 is activated to connect the flash memory 100 to a power (step S200), the controller 160 starts the programming used for a power up procedure or a state machine. The controller 160, serving as a part of the system, starts to access the CF register 150, so as to read address information therefrom and holds the address information in a volatile register capable of high-speed reading, such as a static random access memory (SRAM) or a dynamic random access memory (DRAM) (step S210).

Thereafter, during the programming operation, when performing the ECC operation (step S220), the ECC circuit 130 reads the address information from the volatile register (step S230) and stores a generated error correction code in a spare area or a storage area regulated by the address information (step S240). Additionally, when the ECC operation is performed on the data read from the memory array, the error correction code is read from the spare area or the storage area for performing the error checking/correction related to the read data.

Thus, according to the present embodiment, in the flash memory with the on-chip ECC function, the storage area storing the error correction code generated by the ECC circuit can be changed from the external, without changing address mapping or firmware on the system side, and thereby, the compatibility with the memory system can be achieved.

Hereinafter, description related to a second embodiment of the invention will be set forth. In the embodiment, an example of outputting the address information from the external controller 210 to the flash memory 100 to change the setting contents of the CF register 150 is introduced, but it is more preferable that the user knows ECC-related specifications (e.g., the number of bytes of the generated error correction codes) of the flash memory in advance. In the second embodiment, the external controller 210 is capable of the following: reading information related to the storage area of the error correction codes which is held by the configuration register from the flash memory 100.

Figure 13:
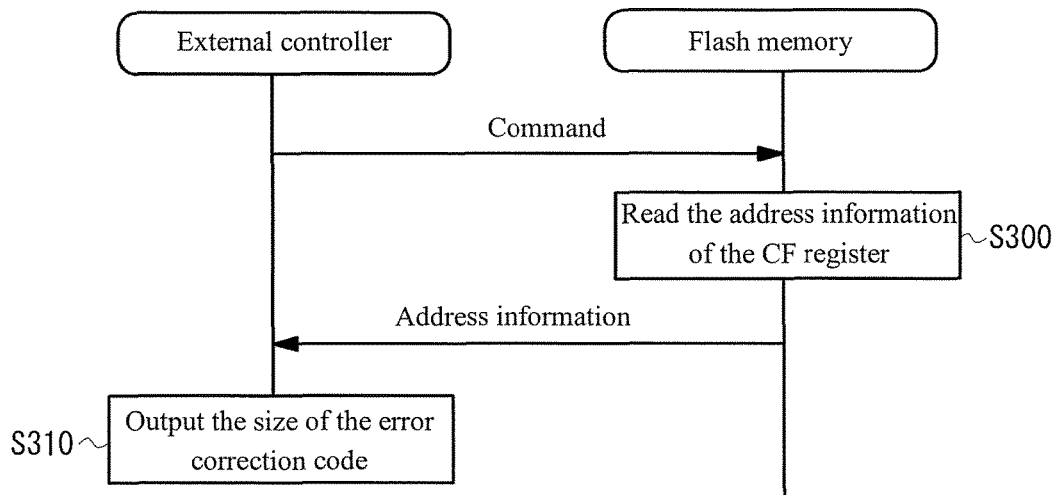
FIG. 13 illustrates an operation sequence according to a second embodiment of the invention.

FIG. 13 illustrates an operation sequence of the second embodiment. First, the external controller 210 outputs a command for reading the contents of the CF register 150 to the flash memory 100. The controller 160 reads the address information held by the CF register 150 based on the specific command (step S300) and outputs the read address information to the external controller 210. The external controller 210, based on the received address information, outputs the ECC specification of the flash memory 100. Thereby, the user can check a size of the error correction code generated by the ECC circuit 130 of the flash memory 100. Thereafter, in the same way as described in the first embodiment, the address information containing a size that is not less than the size of the generated error correction code to the flash memory 100 in the condition of changing the address information of the CF register 150.

Figure 14:
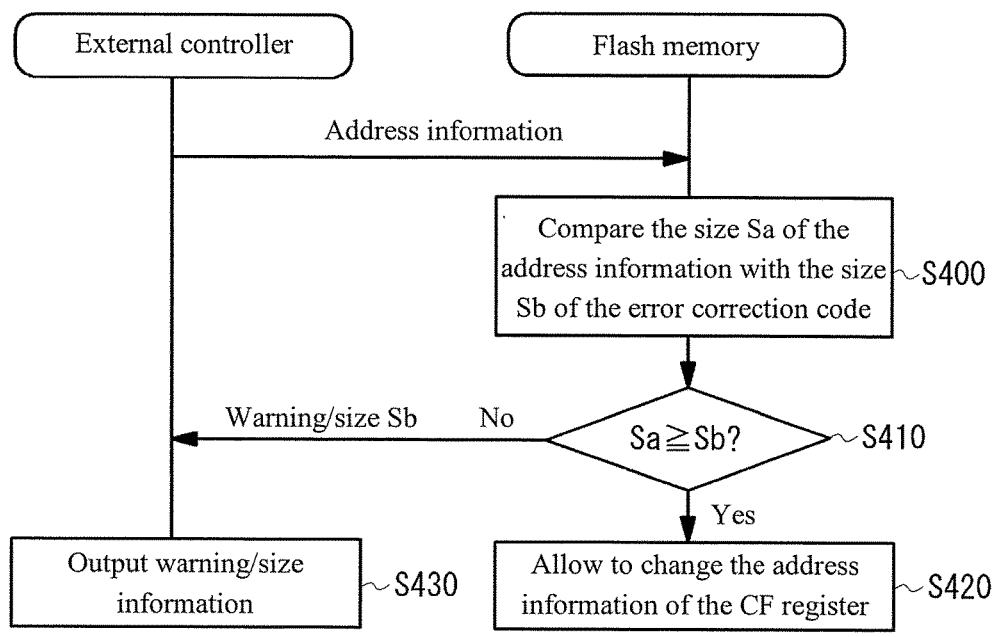
FIG. 14 illustrates an operation sequence according to a third embodiment of the invention

Hereinafter, description related to a third embodiment of the invention will be set forth. In the third embodiment, the controller 160 of the flash memory 100 sends warning information to the external controller 210 in a condition that the size of the address information sent from the external controller 210 is less than that of the error correction code generated by the ECC circuit 130. FIG. 14 illustrates an example of an operation sequence of the third embodiment. As illustrated in FIG. 14, when the address information employed for changing the storage area of the error correction code is sent from the external controller 210 to the flash memory 100, the controller 160 compares a size Sa contained in the sent address information with a size Sb of the error correction code generated by the ECC circuit 130 (step S410). In a condition that the size Sa as changed is greater than or equal to the size Sb of the generated error correction code, the controller 160 changes the address information of the CF register 150 (step S420). In a condition that the size Sa as changed is less than the size Sb of the generated error correction code, the controller 160 sends warning information or information containing the size Sb of the generated error correction code to the external controller 210, and the external controller 210 warns the user by outputting the warning information (step S430).

In addition, the flash memory is provided with a partial page programming function, i.e., a maximum number of programmable times Nop is specified in a condition where data with a size less than a size (2 K bytes) of one page is programmed into one word line for multiple times, so as to prevent bad influence that a high-level programming voltage is repeatedly applied to the same word line. As a modification of the third embodiment, the controller 160 compares the number of the start addresses contained in the address information from the external controller 210 with the maximum number Nop and may also send the warning information to the external controller 210 in a condition that the number of the start addresses is greater than the maximum number Nop.

In the above-described embodiment, an example that the address information for regulating the storage area of the error correction codes is set to the configuration register, but this is only an example, and other non-volatile storage areas may also be used. Such storage area may also be an area hidden from the memory array which is used or referred to by the user. In addition, the address information employed for regulating the storage area of the error correction code may be not only an address indicating a physical address space but also an address indicating a logical address space. Moreover, the non-volatile storage area may also be composed of memory elements, such as an NOR type or NAND type memory element, an electrically erasable programmable read only memory (EEPROM), a magnetic random access memory (MRAM), a resistive random access memory (ReRAM) and so on.

Furthermore, in the above-described embodiments, the flash memory is illustrated; however, the invention may also be adapted to any other semiconductor storage device with the on-chip ECC function or any semiconductor storage device having a memory function (e.g., a semiconductor storage device embedded with a flash memory).

Preferred embodiments of the invention have been described in detail above; however, the invention is not limited to particular embodiments, and various modifications and changes can be made in the invention without departing from the sprit or scope specified in the claims of the invention.

What is claimed is:

1. A semiconductor storage device, comprising:
a memory array;
a page buffer/read circuit, coupled to the memory array;
a non-volatile register;
controller, configured to receive, from an external of the semiconductor storage device, error correction code (ECC) address information identifying a location of an external ECC storage area on a system side, store the ECC address information in the non-volatile register, read the ECC address information from the non-volatile register when being connected to a power, and determine an ECC storage area in the page buffer/read circuit according to the read ECC address information from the non-volatile register, such that a location of the ECC storage area in the page buffer/read circuit determined by the controller
is consistent with the location of the external ECC storage area on the system side; and
an error checking/correction element, configured to generate an ECC to correct errors of data to be stored in the memory array and data read from the memory array, and store the ECC in the ECC storage area in the page buffer/read circuit as determined by the controller according to the read ECC address information from the non-volatile register when an on-chip ECC mode is enabled.

2. The semiconductor storage device according to claim 1, wherein
the ECC address information comprises a start address and a size of the external ECC storage area on the system side.

3. The semiconductor storage device according to claim 2, wherein
the non-volatile register stores a default address information employed to determine a spare area including a default ECC storage area in the page buffer/read circuit before the controller receives the ECC address information from the external, and the controller is further configured to replace the default address information stored in the non-volatile register with the ECC address information after the controller receives the ECC address information from the external, such that a structure of the page buffer/read circuit is changed to have the ECC storage area located in where is consistent with the location of the external ECC storage area on the system side.

4. The semiconductor storage device according to claim 3, further comprising:
an output element, configured to output the default address information stored in the non-volatile register and read by the controller to the external.

5. The semiconductor storage device according to claim 4, wherein the output element outputs warning information to the external when the size of the external ECC storage area on the system side is less than a size of the ECC generated by the error checking/correction element.

6. The semiconductor storage device according to claim 4, wherein
the output element outputs warning information to the external when number of the start addresses contained in the ECC address information is more than a maximum number of consecutive programmable times.

7. The semiconductor storage device according to claim 3, wherein the ECC storage area in the page buffer/read circuit determined by the controller according to the read ECC address information when the on-chip ECC mode is enabled is within the spare area of the page buffer/read circuit determined according to the default address information when the on-chip ECC mode is disabled.

8. The semiconductor storage device according to claim 3, wherein
the controller is further configured to compare the default address information with the ECC address information and determine if the default address information is different from the ECC address information before the controller stores the ECC address information in the non-volatile register, and
when the default address information is different from the ECC address information, the controller replaces the default address information stored in the non-volatile register with the ECC address information.

9. The semiconductor storage device according to claim 3, wherein the changed structure of the page buffer/read circuit has a meta area located in where is consistent with a location of an external meta area on the system side.

10. The semiconductor storage device according to claim 3, wherein the changed structure of the page buffer/read circuit has a free space located in where is consistent with a location of an external meta area on the system side.

11. The semiconductor storage device according to claim 1, wherein
the ECC address information comprises a plurality of start addresses and a size for storing the ECC from each of the plurality of start addresses for identifying a plurality of separated locations of a plurality of the external ECC storage areas on the system side, and
the controller is configured to determine a plurality of the ECC storage areas in the page buffer/read circuit according to the read ECC address information from the non-volatile register, such that the locations of the plurality of the ECC storage area in the page buffer/read circuit determined by the controller are consistent with the separated locations of the plurality of the external ECC storage areas on the system side.

12. The semiconductor storage device according to claim 1, further comprising:
a volatile register, wherein the controller stores the ECC address information read from the non-volatile register in the volatile register, an access speed of the volatile register is greater than an access speed of the non-volatile register, and the error checking/correction element reads the ECC address information from the volatile register to store the ECC in the ECC storage area in the page buffer/read circuit.

13. The semiconductor storage device according to claim 1, wherein the non-volatile register is a rewritable configuration register.

14. A memory system, comprising:
an external controller, configured to output an ECC address information identifying a location of an external ECC storage area on a system side; and
a semiconductor storage device, connected with the external controller, the semiconductor storage device comprising:
a memory array;
a page buffer/read circuit, coupled to the memory array;
a non-volatile register;
a controller, configured to receive the ECC address information from the external controller, store the ECC address information in the non-volatile register, read the ECC address information from the non-volatile register when being connected to a power, and determine an ECC storage area in the page buffer/read circuit according to the read ECC address information from the non-volatile register, such that a location of the ECC storage area in the page buffer/read circuit determined by the controller is consistent with the location of the external ECC storage area on the system side; and an error checking/correction element, configured to generate an ECC to correct errors of data to be stored in the memory array and data read from the memory array, and store the ECC in the ECC storage area in the page buffer/read circuit as determined by the controller according to the read ECC address information from the non-volatile register when an on-chip ECC mode is enabled.

15. The memory system according to claim 14, wherein the external controller receives information identifying a size of the ECC generated by the error checking/correction element from the controller and outputs the ECC address information based on the received information.

16. The memory system according to claim 14, wherein the ECC address information comprises a start address and a size of the external ECC storage area on the system side.

17. The memory system according to claim 16, wherein the non-volatile register stores a default address information employed to determine a spare area including a default ECC storage area in the page buffer/read circuit before the controller receives the ECC address information from the external controller, and the semiconductor storage device further comprises an output element configured to output the default address information stored in the non-volatile register and read by the controller to the external controller, the output element outputs warning information to the external controller in any one of the following conditions:

when the size of the external ECC storage area on the system side is less than a size of the ECC generated by the error checking/correction element; and when number of the start addresses contained in the ECC address information is more than a maximum number of consecutive programmable times.

18. The memory system according to claim 17, wherein the ECC storage area in the page buffer/read circuit determined by the controller according to the read ECC address information when the on-chip ECC mode is enabled is within spare area of the page buffer/read circuit determined according to the default address information when the on-chip ECC mode is disabled.

19. The memory system according to claim 14, further comprising a volatile register, wherein the controller stores the ECC address information read from the non-volatile register in the volatile register, an access speed of the volatile register is greater than an access speed of the non-volatile register, and the error checking/correction element reads the ECC address information from the volatile register to store the ECC in the ECC storage area in the page buffer/read circuit.

* * * * *